(12) United States Patent
Baek et al.

(10) Patent No.: US 11,841,745 B2
(45) Date of Patent: Dec. 12, 2023

(54) DISPLAY DEVICE

(71) Applicant: Samsung Display Co., LTD., Yongin-si (KR)

(72) Inventors: Seung Hwan Baek, Seoul (KR); Hyung Woo Kwon, Seongnam-si (KR); Gyun Soo Kim, Daejeon (KR)

(73) Assignee: Samsung Display Co., LTD., Yongin-si (KR)

( * ) Notice: Subject to any disclaimer, the term of this patent is extended or adjusted under 35 U.S.C. 154(b) by 215 days.

(21) Appl. No.: 16/785,701

(22) Filed: Feb. 10, 2020

(65) Prior Publication Data

US 2020/0264668 A1 Aug. 20, 2020

(30) Foreign Application Priority Data

Feb. 14, 2019 (KR) ........................ 10-2019-0017042

(51) Int. Cl.

| | |
|---|---|
| *G06F 3/16* | (2006.01) |
| *G06F 3/041* | (2006.01) |
| *H01L 25/18* | (2023.01) |
| *H05K 1/14* | (2006.01) |
| *G06F 1/16* | (2006.01) |
| *H05K 1/11* | (2006.01) |

(52) U.S. Cl.
CPC .......... *G06F 1/1652* (2013.01); *G06F 1/1643* (2013.01); *G06F 3/0412* (2013.01); *H01L 25/18* (2013.01); *H05K 1/118* (2013.01); *H05K 1/148* (2013.01); *G06F 2203/04102* (2013.01)

(58) Field of Classification Search
CPC .... G06F 1/1626; G06F 1/1637; G06F 1/1643; G06F 1/1652; G06F 1/203; G06F 3/0412; G06F 2203/04102; H01L 25/18; H05K 1/118; H05K 1/148

USPC ................................................. 345/173–174
See application file for complete search history.

(56) References Cited

U.S. PATENT DOCUMENTS

| | | |
|---|---|---|
| 9,535,522 B2 | 1/2017 | Ahn |
| 9,977,466 B2 | 5/2018 | Kwon et al. |
| 10,121,988 B2 | 11/2018 | Oh et al. |
| 10,251,291 B2 | 4/2019 | Ahn et al. |

(Continued)

FOREIGN PATENT DOCUMENTS

| | | |
|---|---|---|
| CN | 107871713 | 4/2018 |
| KR | 10-2017-0065058 | 6/2017 |

(Continued)

OTHER PUBLICATIONS

Notice of Allowance dated Aug. 30, 2023, issued to Korean Patent Application No. 10-2019-0017042.

*Primary Examiner* — Kwin Xie
(74) *Attorney, Agent, or Firm* — H.C. Park & Associates, PLC

(57) ABSTRACT

A display device including a display panel which includes a main region configured to display an image and a protrusion region protruding from one side of the main region to be bent, a lower film which is disposed on a rear surface of the display panel, and a metal layer which is disposed on a rear surface of the lower film and comprises a notch region. The protrusion region includes a first bending portion which has a first curvature and a pad portion which faces the main region in a thickness direction of the display panel, and the pad region is disposed in the notch region.

18 Claims, 13 Drawing Sheets

(56) References Cited

U.S. PATENT DOCUMENTS

| | | | |
|---|---|---|---|
| 10,490,755 B2 | 11/2019 | Jang et al. | |
| 2016/0077550 A1* | 3/2016 | Zhang | G06F 3/0484 |
| | | | 715/765 |
| 2016/0179229 A1* | 6/2016 | Ahn | H01L 27/3262 |
| | | | 345/173 |
| 2016/0327987 A1* | 11/2016 | Huitema | G04G 17/045 |
| 2017/0162821 A1 | 6/2017 | Oh et al. | |
| 2018/0074553 A1* | 3/2018 | Yamazaki | H05B 33/02 |
| 2018/0081399 A1 | 3/2018 | Kwon et al. | |
| 2018/0219165 A1* | 8/2018 | Kwon | G06F 1/1652 |
| 2018/0219179 A1 | 8/2018 | Son et al. | |
| 2018/0246544 A1 | 8/2018 | Kwon et al. | |
| 2019/0212781 A1* | 7/2019 | Fujimoto | G06F 1/1643 |
| 2020/0192433 A1* | 6/2020 | Shin | H01L 51/529 |

FOREIGN PATENT DOCUMENTS

| | | |
|---|---|---|
| KR | 10-2017-0099944 | 9/2017 |
| KR | 10-2018-0032742 | 4/2018 |
| KR | 10-2018-0113219 | 10/2018 |
| KR | 10-2019-0006152 | 1/2019 |

\* cited by examiner

DISPLAY DEVICE

CROSS REFERENCE TO RELATED APPLICATION

This application claims priority from and the benefit of Korean Patent Application No. 10-2019-0017042, filed on Feb. 14, 2019, which is hereby incorporated by reference for all purposes as if fully set forth herein.

BACKGROUND

Field

Exemplary embodiments of the invention relate generally to a display device and, more specifically, to a foldable display device.

Discussion of the Background

Electronic devices, such as a smart phone, a tablet personal computer (PC), a digital camera, a notebook computer, a navigation device, and a television (TV), which provide images to a user, include a display device for displaying images. The display device includes a display panel configured to generate and display an image and various input devices.

In the display panel, in order to increase a display region in which an image is displayed, a non-display region in which a driving circuit and the like are disposed may be bent to face the display region. Various cables of a touch panel and the like disposed on the display panel may be bent together in a bending region of the display panel.

The display device may be exposed to various external impacts during a production process or in use thereof. In particular, since the bending region in which various cables are mounted is sensitive to the external impacts, there is a need for a method of protecting the bending region from the external impacts.

The above information disclosed in this Background section is only for understanding of the background of the inventive concepts, and, therefore, it may contain information that does not constitute prior art.

SUMMARY

Devices constructed/methods according to exemplary embodiments of the invention are capable of reducing a damage from an external impact by decreasing a radius of curvature of a region in which a display panel is bent.

Additional features of the inventive concepts will be set forth in the description which follows, and in part will be apparent from the description, or may be learned by practice of the inventive concepts.

According to an exemplary embodiment of the inventive concepts, a display device comprises a display panel which comprises a main region configured to display an image and a protrusion region protruding from one side of the main region to be bent, a lower film which is disposed on a rear surface of the display panel, and a metal layer which is disposed on a rear surface of the lower film and comprises a notch region, wherein the protrusion region comprises a first bending portion which has a first curvature and a pad portion which faces the main region in a thickness direction of the display panel, and the pad region is disposed in the notch region.

The metal layer may comprise a first edge and a second edge at one end thereof, and the notch region is disposed between the first edge and the second edge.

The notch region may be an incision region of the metal layer.

A shape of the notch region may be the same as a shape of the pad portion.

The notch region may surround an edge of the pad portion when viewed from above.

A size of the notch region may be greater than a size of the pad portion.

The lower film may be disposed only on the main region and the pad portion.

The lower film may comprise an interval maintenance member between the pad portion and the main region overlapping the pad portion.

The lower film may comprise at least one of a heat dissipation layer, an electromagnetic wave shielding layer, a light blocking layer, and a buffer layer.

The display device may further comprise a touch panel disposed on the display panel.

The touch panel may comprise a touch circuit board, and the touch circuit board comprises a second bending portion which has a second curvature and a non-bending portion which faces the main region in the thickness direction of the display panel.

The non-bending portion may be disposed in the notch region.

The first curvature may be less than the second curvature.

The first bending portion and the second bending portion may be spaced apart from each other.

The display device may further comprise a stress control member disposed on the protrusion region.

A portion of the stress control member may overlap the notch region.

The display device may further comprise a lower cover disposed under the metal layer.

An inner side surface of the lower cover, which faces the first bending portion, may have a third curvature.

The first curvature may be less than the third curvature.

The inner side surface of the lower cover and the first bending portion may be spaced apart from each other.

According to another exemplary embodiment of the inventive concepts, a display device comprises a display panel which comprises a main region configured to display an image and a protrusion region protruding from one side of the main region to be bent, a lower film which is disposed on a rear surface of the display panel, and a metal layer which is disposed on a rear surface of the lower film.

The metal layer surrounds the protrusion region of the bent display panel and does not overlap the protrusion region in a thickness direction thereof.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION OF THE EMBODIMENTS

Figure 1:
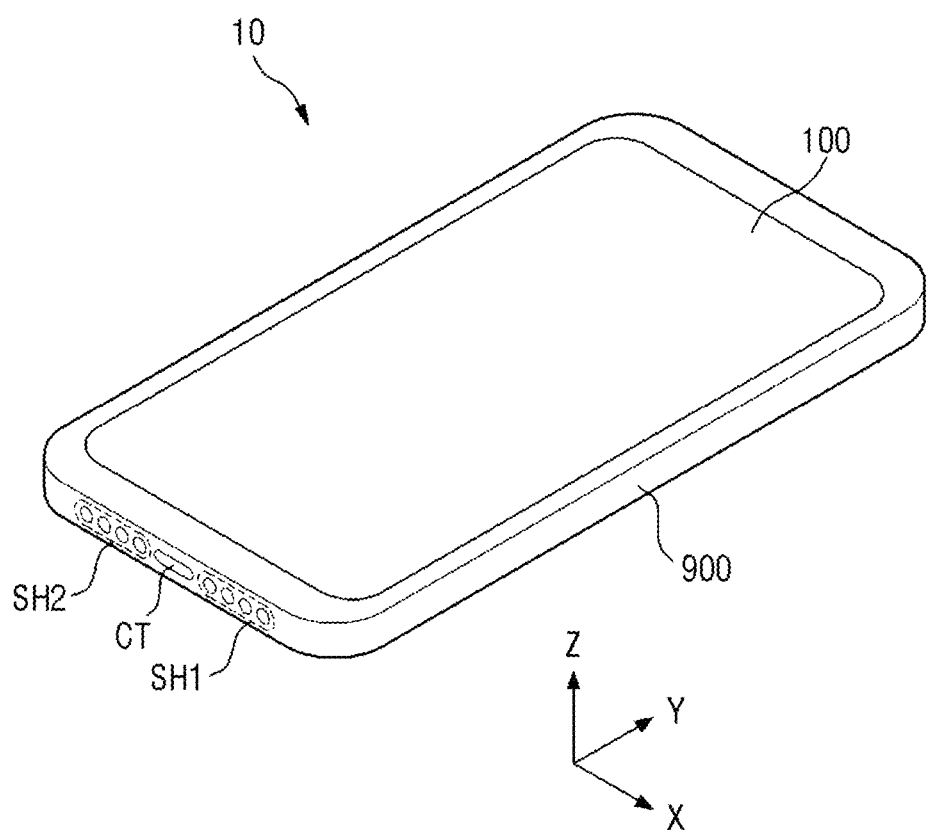
FIGS. 1 and 2 are a perspective view and an exploded perspective view illustrating a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z-axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
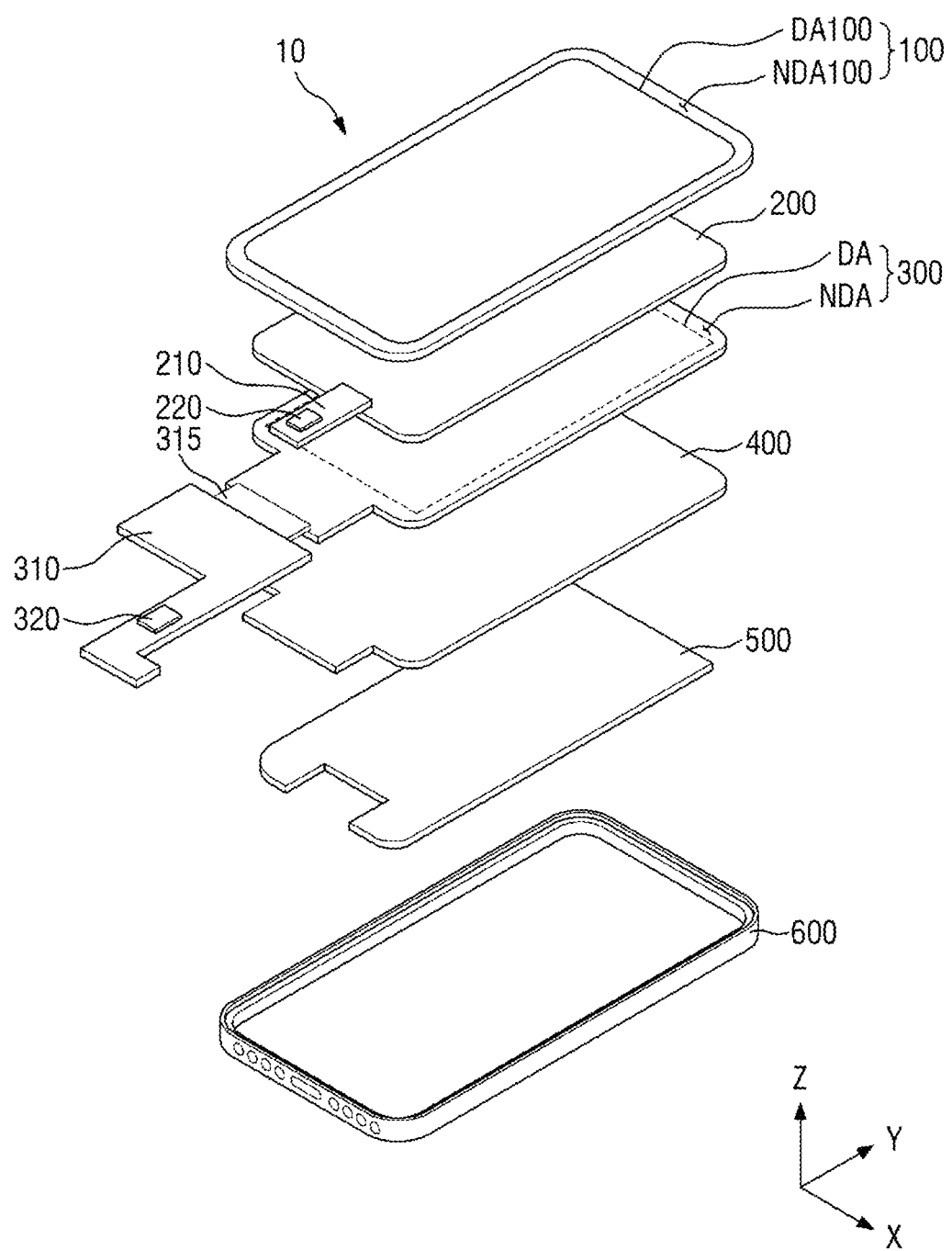
Figure 3:
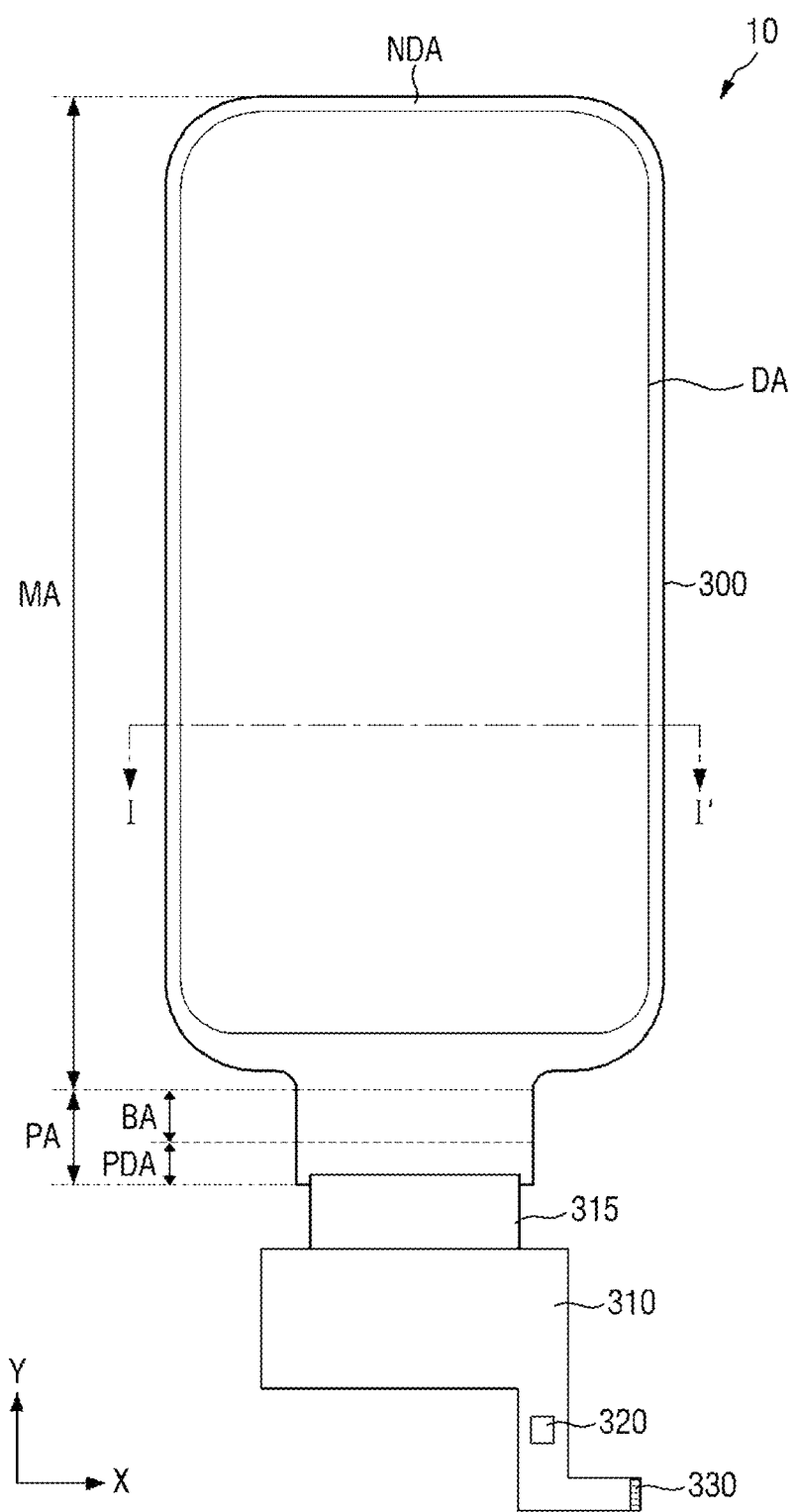
FIG. 3 is a plan view illustrating a display panel according to the exemplary embodiment.
Figure 4A:
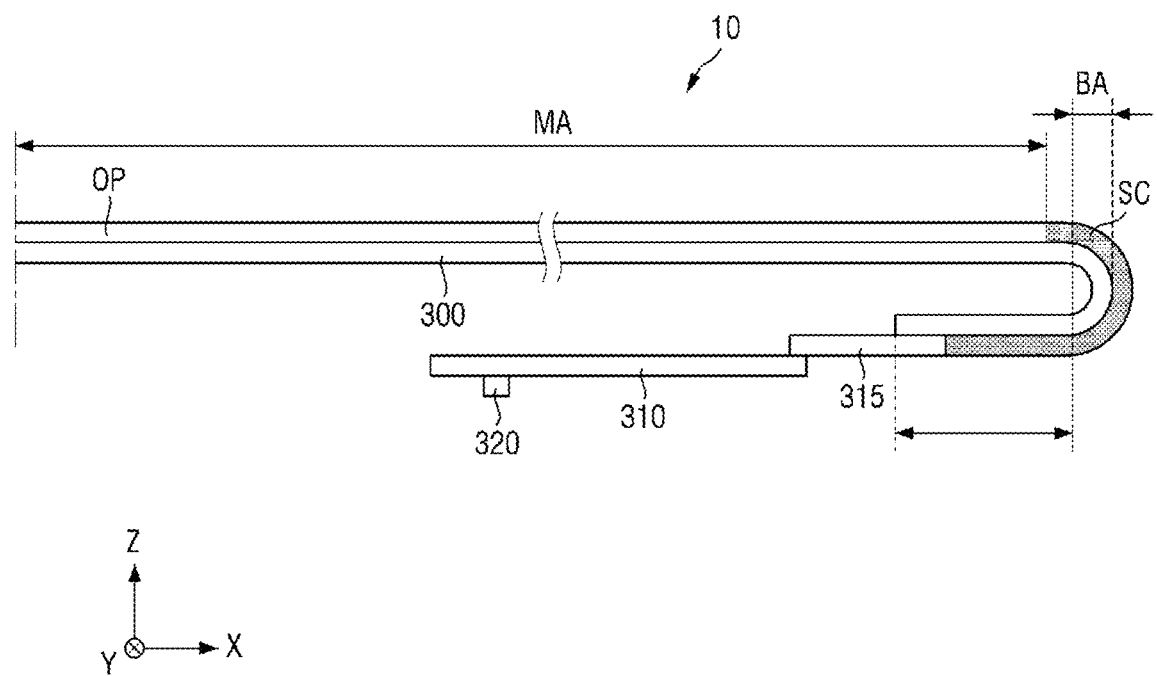
FIGS. 4A and 4B are side views illustrating the display panel according to the exemplary embodiment.
Figure 4B:
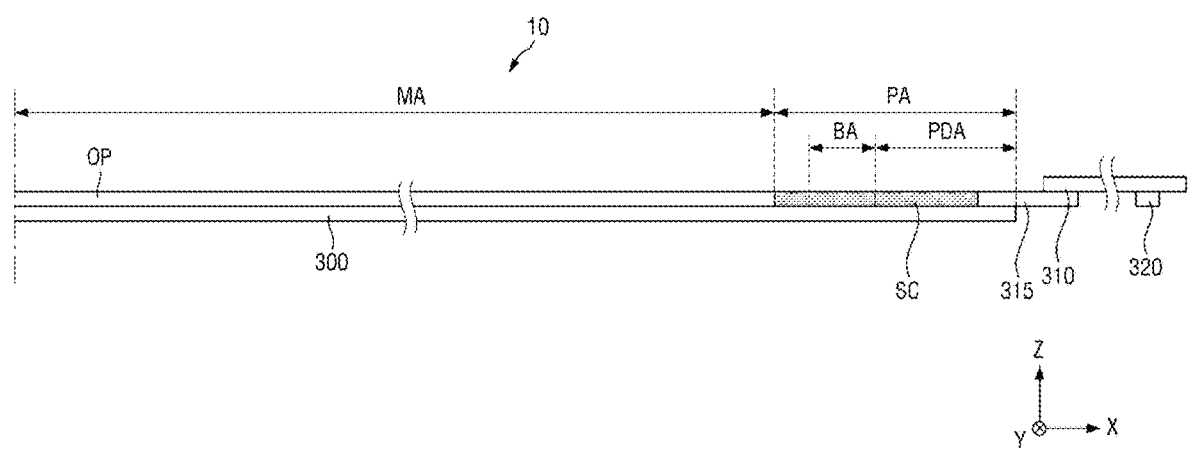
Figure 5:
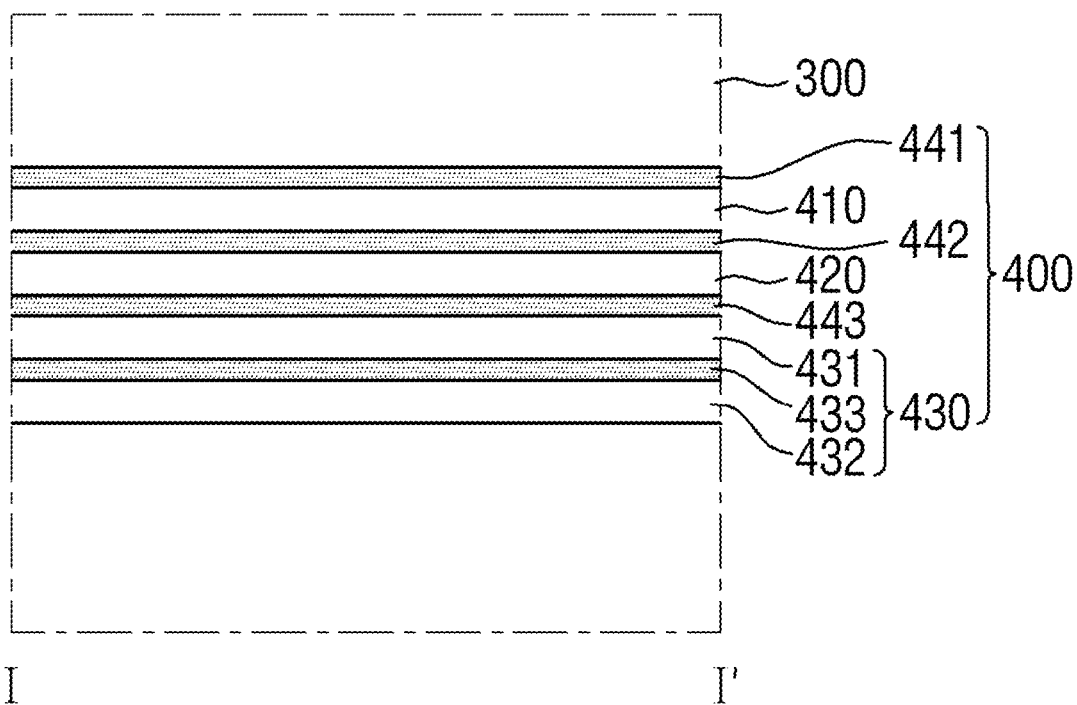
FIG. 5 is a cross-sectional view illustrating the display panel including a panel lower member according to the exemplary embodiment.
Figure 6:
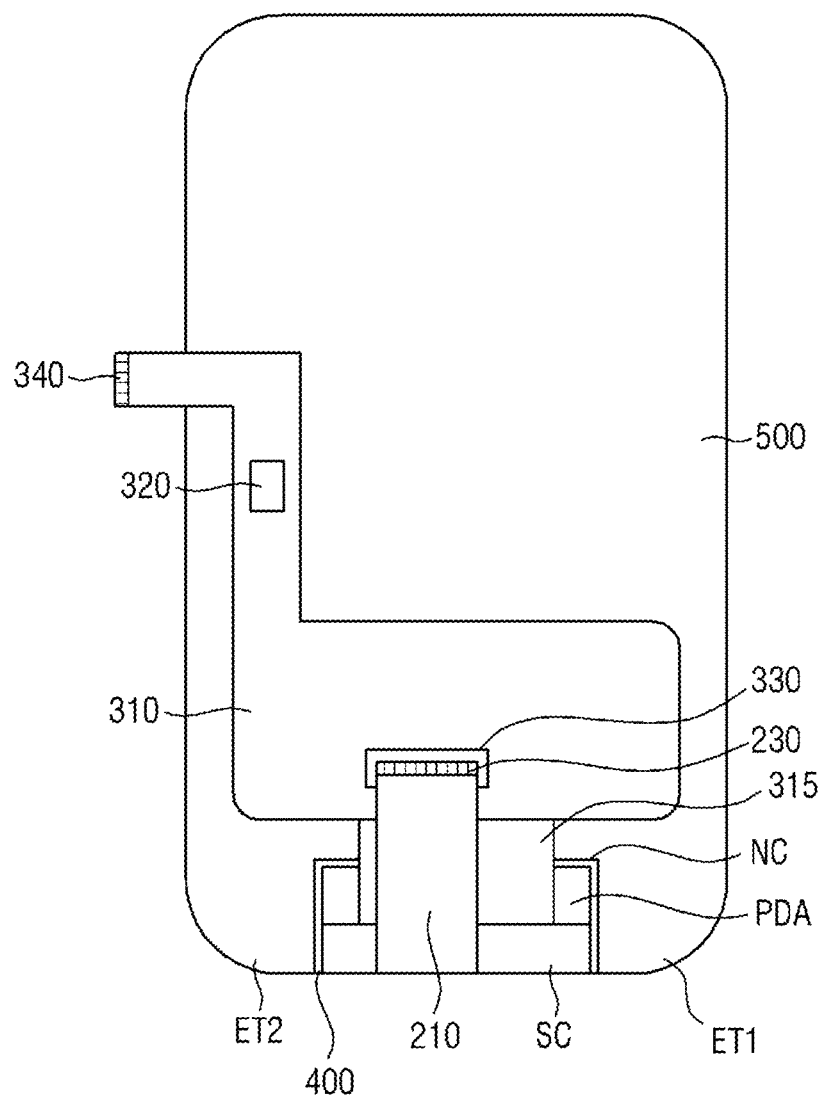
FIG. 6 is a rear view illustrating a panel lower member, a protection panel, a panel circuit board, and a touch circuit board in the display device of FIG. 2.

FIGS. 1 and 2 are a perspective view and an exploded perspective view illustrating a display device according to an exemplary embodiment. FIG. 3 is a plan view illustrating a display panel according to the exemplary embodiment. FIGS. 4A and 4B are side views illustrating the display panel according to the exemplary embodiment. FIG. 5 is a cross-sectional view illustrating the display panel including a panel lower member according to the exemplary embodiment. FIG. 6 is a rear view illustrating a panel lower member, a protection panel, a panel circuit board, and a touch circuit board in the display device of FIG. 2.

Referring to FIGS. 1 to 6, the display device according to the exemplary embodiment is illustrated as being a portable terminal. The portable terminal may include a smart phone, a tablet personnel computer (PC), a personal digital assistant (PDA), a portable multimedia player (PMP), a game machine, a wristwatch-type electronic device, and the like. However, the present disclosure is not limited to the portable terminal, and the display device according to the exemplary embodiment may be used in a large-sized electronic device such as a television or an external billboard as well as small to medium-sized electronic devices such as a monitor, a notebook computer, a car navigation device, and a camera.

Referring to FIGS. 1 and 2, the display device 10 according to the exemplary embodiment includes a cover window 100, a touch sensing device 200, a touch circuit board 210, a display panel 300, a display circuit board 310, a panel lower member 400, a protection panel 500, and a lower cover 600.

In the present specification, the terms "upper portion," "top," and "upper surface" refer to a direction in which the cover window 100 is disposed with respect to the display panel 300, that is, a Z-axis direction, and the terms "lower portion," "bottom," and "lower surface" refer to a direction in which the panel lower member 400 is disposed with respect to the display panel 300, that is, a direction opposite to the Z-axis direction.

The display device 10 may be formed in a rectangular shape when viewed from above. For example, a top view of the display device 10 may show a rectangular shape which has a short side in a first direction (X-axis direction) and a long side in a second direction (Y-axis direction). A corner at which the short side in the first direction (X-axis direction) meets the long side in the second direction (Y-axis direction) may be rounded to have a certain curvature or formed at a right angle. The shape of the top view of the display device 10 is not limited to the rectangular shape but may be formed in another polygonal shape, circular shape, or elliptical shape.

The cover window 100 may be disposed on an upper portion of the display panel 300 to cover an upper surface of the display panel 300. Therefore, the cover window 100 may function to protect the upper surface of the display panel 300. The cover window 100 may be attached to the touch sensing device 200 through an adhesive layer. The adhesive layer may be an optically cleared adhesive film (OCA) or an optically cleared resin (OCR).

The cover window 100 may include a light transmitting portion DA100 corresponding to a display region DA of the display panel 300 and a light blocking portion NDA100 corresponding to a non-display region NDA of the display panel 300. The light blocking portion NDA100 of the cover window 100 may be formed to be opaque. Alternatively, the light blocking portion NDA100 of the cover window 100 may be formed as a decor layer having a pattern which is visible by a user when an image is not displayed. For example, a company logo such as "SAMSUNG" or various characters may be patterned on the light blocking portion NDA100 of the cover window 100.

The cover window 100 may be made of glass, sapphire, and/or plastic. The cover window 100 may be formed to be rigid or flexible.

The touch sensing device 200 may be disposed between the cover window 100 and the display panel 300. The touch sensing device 200 may be a device configured to sense a touch position of a user and may be implemented as a capacitance type, such as a self-capacitance type or a mutual capacitance type, or an infrared type.

The touch sensing device 200 may be formed in a panel form or a film form. Alternatively, the touch sensing device 200 may be integrally formed with the display panel 300. For example, when the touch sensing device 200 is formed in the film form, the touch sensing device 200 may be integrally formed with a barrier film configured to encapsulate the display panel 300.

The touch sensing device 200 may include a pressure sensor capable of sensing pressure of a user. Alternatively, a separate pressure sensing device including a pressure sensor capable of sensing pressure of a user may be attached on the touch sensing device 200.

The touch circuit board 210 may be attached to one side of the touch sensing device 200. Specifically, the touch circuit board 210 may be attached on pads provided on one side of the touch sensing device 200 using an anisotropic conductive film. The touch circuit board 210 may be provided with a touch connection portion 230 as shown in FIG. 6, and the touch connection portion 230 may be connected to a first connector 330 of the display circuit board 310. The touch circuit board 210 may be a flexible printed circuit board or a chip-on film.

A touch driving circuit 220 may apply touch driving signals to the touch sensing device 200, may sense sensing signals from the touch driving circuit 220, and may analyze the sensing signals to calculate a touch position of a user. The touch driving circuit 220 may be formed as an integrated circuit and may be mounted on the touch circuit board 210.

Referring to FIGS. 3, 4A, and 4B, the display panel 300 may include a main region MA and a protrusion region PA protruding from one side of the main region MA.

The main region MA may be formed as a rectangular plane which has a short side in the first direction (X-axis direction) and a long side in the second direction (Y-axis direction) intersecting with the first direction (X-axis direction). A corner at which the short side in the first direction (X-axis direction) meets the long side in the second direction (Y-axis direction) may be rounded to have a certain curvature or formed at a right angle. The planar shape of the display device 10 is not limited to the rectangular shape but may be formed in another polygonal shape, circular shape, or elliptical shape.

The main region MA may be formed to be flat, but the present disclosure is not limited thereto. The main region MA may include curved portions formed at left and right ends thereof. In this case, the curved portion may have a constant curvature or have a variable curvature.

The main region MA may include the display region DA in which pixels are formed to display an image and the non-display region NDA which is a peripheral region of the display region DA. The display region DA may overlap the light transmitting portion DA100 of the cover window 100, and the non-display region NDA may overlap the light blocking portion NDA100 of the cover window 100.

Not only the pixels but also scan lines, data lines, and power supply lines connected to the pixels may be disposed in the display region DA. When the main region MA includes the curved portion, the display region DA may be disposed in the curved portion. In this case, an image of the display panel 300 may also be viewed on the curved portion.

The non-display region NDA may be defined as a region from an outermost portion of the display region DA to an edge of the display panel 300. A scan driver configured to apply scanning signals to the scan lines, and link lines configured to connect the data lines and a display driving circuit 320 may be disposed in the non-display region NDA.

The protrusion region PA may protrude from one side of the main region MA. For example, the protrusion region PA may protrude from a lower side of the main region MA. A length of the protrusion region PA in the first direction (X-axis direction) may be less than a length of the main region MA in the first direction (X-axis direction).

The protrusion region PA may include a bending region BA and a pad region PDA. In this case, the pad region PDA may be disposed at one side of the bending region BA, and the main region MA may be disposed at the other side of the bending region BA. For example, the pad region PDA may be disposed at a lower side of the bending region BA, and the main region MA may be disposed at an upper side of the bending region BA.

The display panel 300 may be flexible so as to be bendable, foldable, or rollable. Therefore, the display panel 300 may be bent in a thickness direction (Z-axis direction) from the bending region BA. In this case, as shown in FIG. 4A, before the display panel 300 is bent, one surface of the pad region PDA of the display panel 300 faces upward, and as shown in FIG. 4B, after the display panel 300 is bent, one surface of the pad region PDA of the display panel 300 faces downward. Accordingly, as shown in FIG. 4A, the pad region PDA may be bent to be positioned below a lower portion of the main region MA and thus may overlap the main region MA.

Pads electrically connected to the display circuit board 310 may be disposed in the pad region PDA of the display panel 300. The display circuit board 310 may be connected to a main circuit board to be described below through a second connector 340.

The display circuit board 310 may be attached on the pads using an anisotropic conductive film. As a result, lead lines of the display circuit board 310 may be electrically connected to the pads. The display circuit board 310 may be a flexible film such as a flexible printed circuit board, a printed circuit board, or a chip-on film.

The display driving circuit 320 may be mounted on the display circuit board 310. The display driving circuit 320 outputs signals and voltages for driving the display panel 300. For example, the display driving circuit 320 may supply data voltages to the data lines. In addition, the display driving circuit 320 may supply a power supply voltage to a power supply line and may supply scan control signals to the scan driver. The display driving circuit 320 may be formed as an integrated circuit (IC) and may be mounted on the display panel 300 in the pad region PDA through a chip-on-glass (COG) method, a chip-on-plastic (COP) method, or an ultrasonic bonding method.

According to an exemplary embodiment, the display circuit board 310 may further include an auxiliary circuit board 315 as shown in FIG. 6. The auxiliary circuit board 315 may be formed as an IC and may be mounted on the display panel 300 in the pad region PDA through a COG method, a COP method, or an ultrasonic bonding method. The auxiliary circuit board 315 electrically connects the display circuit board 310 and the display panel 300.

The display panel 300 may be a light-emitting display panel including a light-emitting element. For example, the display panel 300 may be an organic light-emitting display panel using an organic light-emitting diode, a micro light-emitting diode (LED) display panel using a micro LED, and a quantum dot light-emitting display panel including a quantum dot LED. Hereinafter, it will be mainly described that the display panel 300 is the organic light-emitting display panel.

As shown in FIGS. 4A and 4B, an anti-reflection panel OP may be disposed on the upper surface of the display panel 300 to prevent degradation of visibility due to external light reflection. The anti-reflection panel OP may include a polarizing film and/or a phase retarding film. The polarizing film and the phase retarding film may be common stretched films. In this case, an adhesive member, may be further provided between the anti-reflection panel OP and the display panel DP. Meanwhile, the anti-reflection panel OP may be omitted.

A stress control member SC is disposed on an entire surface of the display circuit board 310. The stress control member SC is disposed in the protrusion region PA. The stress control member SC may be disposed to correspond to at least the bending region BA.

The stress control member SC allows a neutral plane in the bending region BA to be designed adjacent to the display circuit board 310. Since compressive stress and tensile stress are applied to the neutral plane at the same magnitude, the neutral plane may be a plane that receives substantially a stress of "zero." A portion of the stress control member SC may also overlap the pad region PDA. The stress control member SC may include an insulating material and may include a soft material. The stress control member SC may be a resin which is applied on the display circuit board 310. However, the present disclosure is not limited thereto, and the stress control member SC may be disposed as a separate film layer.

Referring to FIG. 5, the panel lower member 400 may be disposed on a lower surface of the display panel 300. The panel lower member 400 may include at least one of a heat dissipation layer configured to efficiently dissipate heat from the display panel 300, an electromagnetic wave shielding layer configured to shield an electromagnetic wave, a light blocking layer configured to block light incident from the outside, a light absorption layer configured to absorb light incident from the outside, and a buffer layer configured to absorb an external impact.

Specifically, as shown in FIG. 5, the panel lower member 400 may include a light absorption member 410, a buffer member 420, a heat dissipation member 430, and first, second, and third adhesive layers 441, 442, and 443.

The light absorption member 410 may be disposed below the display panel 300. The light absorption member 410 prevents transmission of light to prevent components disposed below the light absorption member 410 from being viewed from above the display panel 300. The light absorption member 410 may include a light absorption material such as a black pigment or a dye.

The buffer member 420 may be disposed under the light absorption member 410. The buffer member 420 absorbs an external impact to prevent the display panel 300 from being damaged. The buffer member 420 may include a single layer or a plurality of layers. For example, the buffer member 420 may be made of a polymer resin, such as polyurethane, polycarbonate, polypropylene, or polyethylene, or may be made of a material having elasticity, such as a sponge formed by foam-molding rubber, a urethane-based material, or an acrylic-based material. The buffer member 420 may be a cushioning layer.

The heat dissipation member 430 may be disposed under the buffer member 420. The heat dissipation member 430 may include at least one heat dissipation layer. For example, as shown in FIG. 4C, the heat dissipation member 430 may include a first heat dissipation layer 431 including graphite or carbon nanotubes, a second heat dissipation layer 432 formed as a thin film formed of a metal such as copper, nickel, ferrite, or silver, which is capable of shielding an electromagnetic wave and has high heat conduction quality, and a fourth adhesive layer 433 configured to bond the first heat dissipation layer 431 and the second heat dissipation layer 432.

The first adhesive layer 441 attaches the light absorption member 410 to the lower surface of the display panel 300. The second adhesive layer 442 attaches the buffer member 420 to a lower surface of the light absorption member 410. The third adhesive layer 443 attaches the heat dissipation member 430 to a lower surface of the buffer member 420. Each of the first, second, and third adhesive layers 441, 442 and 443 may include a polymer material classified into a silicone-based polymer, a urethane-based polymer, a silicone-urethane (SU) hybrid polymer, an acrylic-based polymer, an isocyanate-based polymer, a polyvinyl alcohol-based polymer, a gelatin-based polymer, a vinyl-based polymer, a latex-based polymer, a polyester-based polymer, an aqueous polyester based-polymer, etc.

The protection panel 500 is disposed on a rear surface of the panel lower member 400 to support the display panel 300. The protection panel 500 may be disposed to overlap the main region MA of the display panel 300. The protection panel 500 may be a metal plate having a rigidity greater than or equal to a reference. The protection panel 500 may be a stainless steel plate. The protection panel 500 may be formed to be opaque to block external light incident on the display panel 300.

A lower frame may be disposed below the protection panel 500. The lower frame may be disposed to surround the cover window 100, the touch sensing device 200, the display panel 300, the panel lower member 400, and the protection panel 500. The lower frame may include a synthetic resin, a metal, or both of the synthetic resin and the metal.

A side surface of the lower frame may be exposed at a side surface of the display device 10, or the lower frame may be omitted and only the lower cover 600 may be present according to some embodiments of the display device 10.

A main circuit board may be disposed under the lower frame. A main processor may control all functions of the display device 10. For example, the main processor may output image data to the display driving circuit 320 of the display circuit board 310 such that the display panel 300 displays an image. The main processor may be an application processor formed as an IC.

The lower cover 600 may be disposed below the display panel 300, the panel lower member 400, the protection panel 500, the lower frame, and the main circuit board. The lower cover 600 may form an exterior of a lower surface of the display device 10. A charging terminal hole for exposing a charging terminal and speaker holes may be formed in one side surface of the lower cover 600. The lower cover 600 may include plastic and/or a metal.

Hereinafter, a coupling structure of a notch region formed in the protection panel 500 and the protrusion region PA of the display panel 300 will be described in detail with reference to FIGS. 7 to 10.

Figure 7:
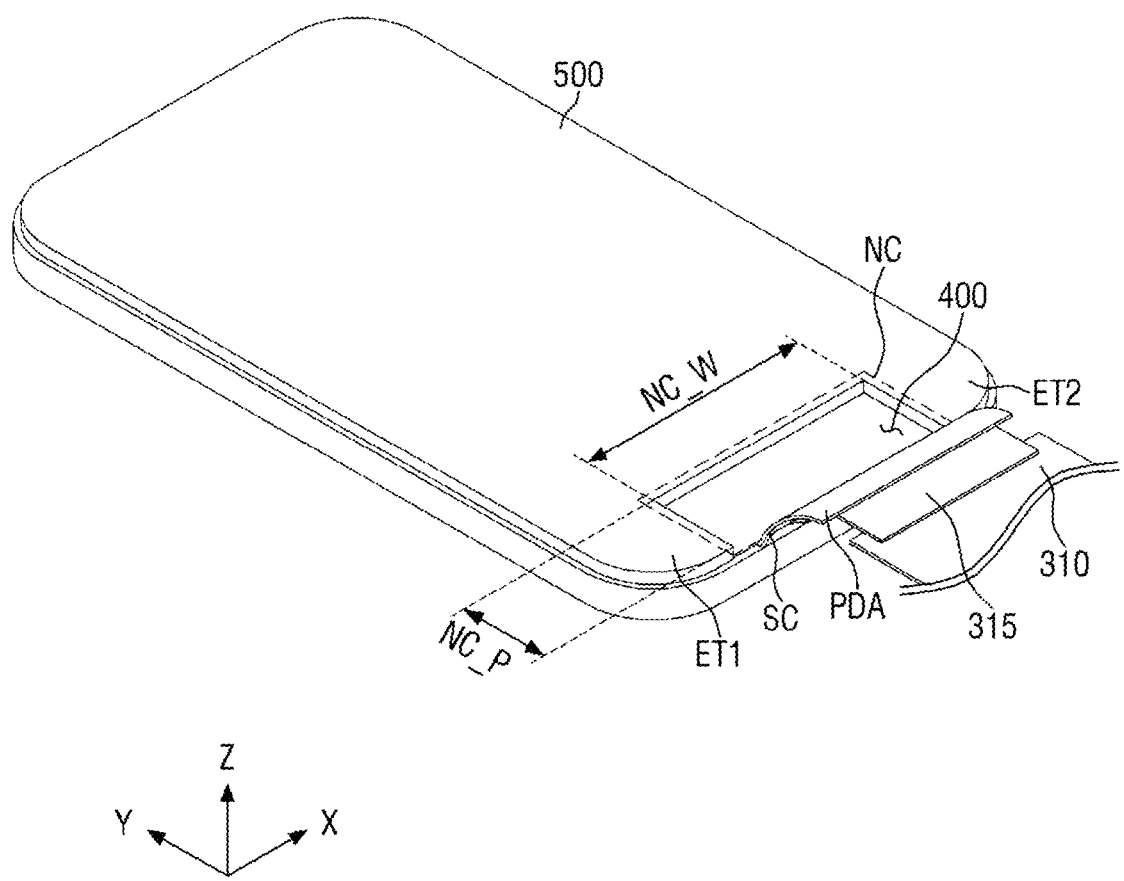
FIG. 7 is a rear perspective view illustrating the display device before the display panel is bent.
Figure 8:
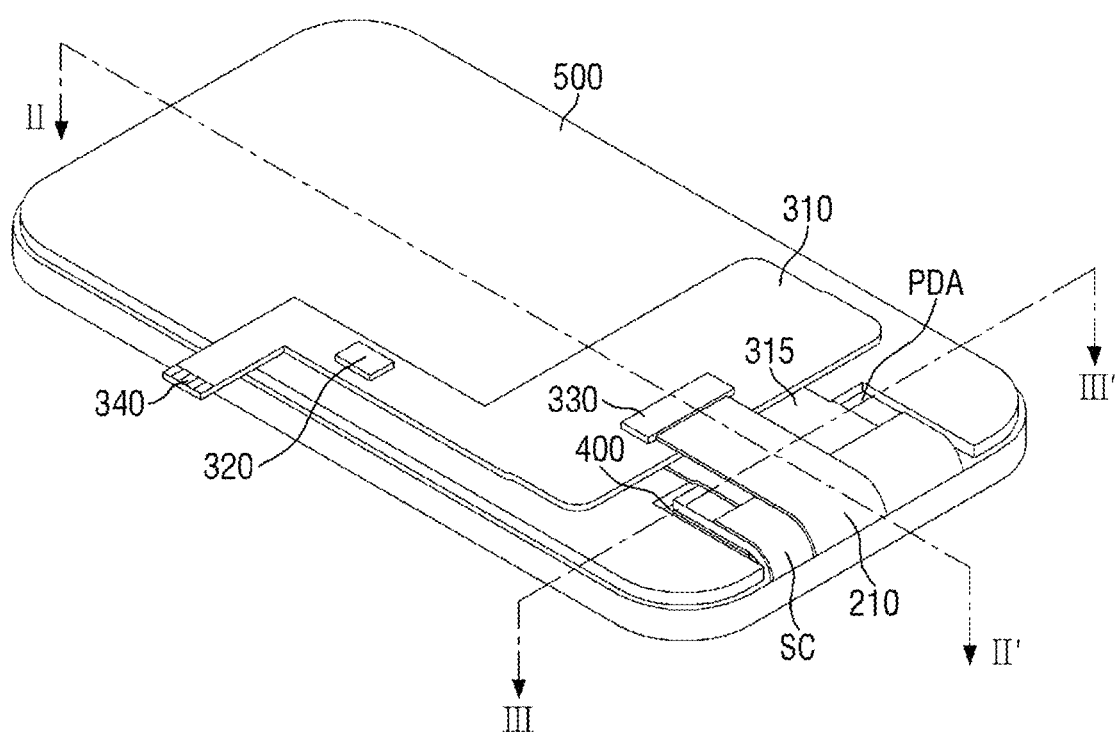
FIG. 8 is a rear perspective view illustrating the display device after the display panel is bent.
Figure 9:
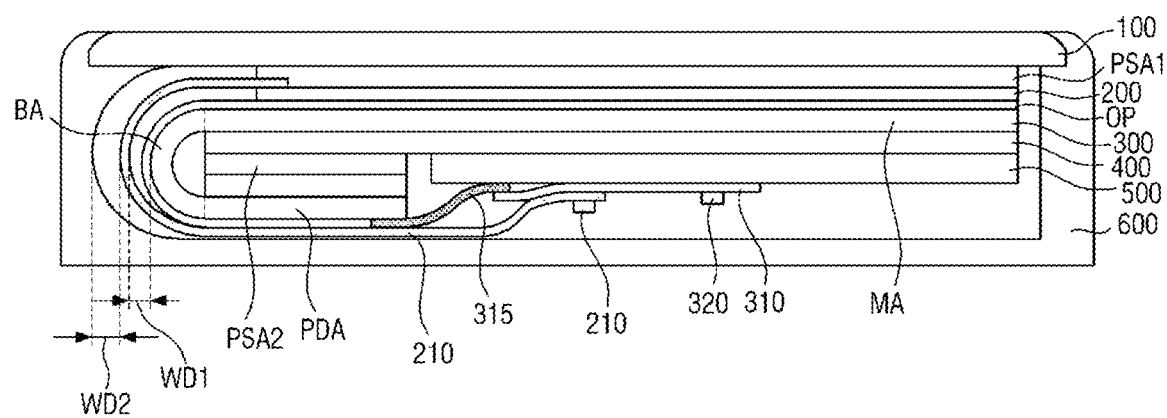
FIG. 9 is a cross-sectional view taken along line II-IF of FIG. 8 according to the exemplary embodiment.
Figure 10:
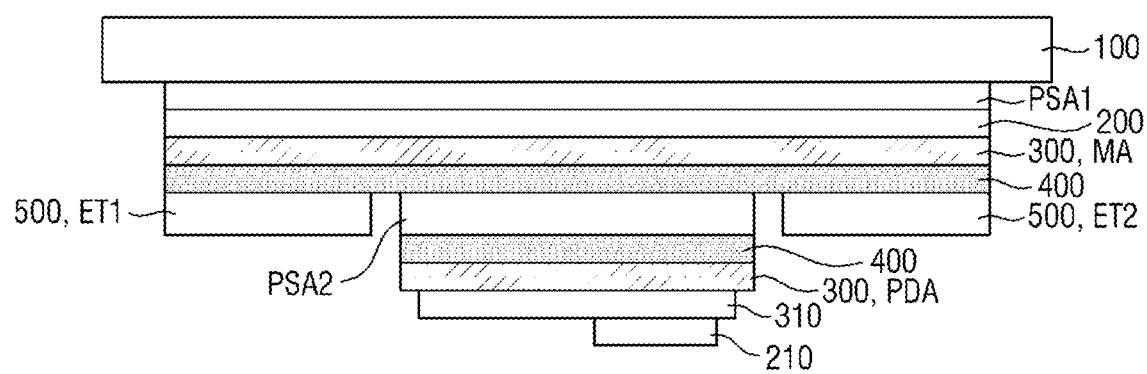
FIG. 10 is a cross-sectional view taken along line of FIG. 8 according to the exemplary embodiment.

FIG. 7 is a rear perspective view illustrating the display device before the display panel is bent. FIG. 8 is a rear perspective view illustrating the display device after the display panel is bent. FIG. 9 is a cross-sectional view taken along line II-II' of FIG. 8 according to the exemplary embodiment. FIG. 10 is a cross-sectional view taken along line of FIG. 8 according to the exemplary embodiment.

Referring to FIGS. 7 to 10, the protection panel 500 according to the exemplary embodiment may have a rectangular shape when viewed from below. For example, a top view of the protection panel 500 may show a rectangular shape which has a short side in the first direction (X-axis direction) and a long side in the second direction (Y-axis direction). A corner at which the short side in the first direction (X-axis direction) meets the long side in the second direction (Y axis direction) may be rounded to have a certain curvature or formed at a right angle. The shape of the tope view of the protection panel 500 is not limited to the rectangular shape, but may be formed in another polygonal shape, circular shape, or elliptical shape.

The protection panel 500 may include a notch region NC capable of accommodating at least portions of the protrusion region PA of the display panel 300, the display circuit board 310, and the touch circuit board 210, and a first edge ET1 and a second edge ET2 which are located at both sides of the notch region NC. In other words, the notch region NC may have a shape which is bent from the first edge ET1 and the second edge ET2 and is recessed into the display panel 300. That is, the notch region NC may refer to an incision region of the protection panel 500. According to an exemplary embodiment, the notch region NC may have a first length NC_W in the first direction (X-axis direction) and may be recessed into the display panel 300 by a second distance NC_P from the first edge ET1 and the second edge ET2 in the second direction (Y-axis direction).

As described above, the protrusion region PA of the display panel 300 may include the bending region BA and the pad region PDA. The bending region BA may not overlap the notch region NC in a thickness direction of the display panel 300. The pad region PDA may be disposed to overlap the main region MA in the thickness direction of the display panel 300. According to an exemplary embodiment, a shape of the notch region NC may be the same as a shape of the pad region PDA. For example, when the pad region PDA has a rectangular shape when viewed from above, the shape of the notch region NC may also be a rectangular shape when viewed from above. The shape of the pad region PDA is not limited thereto and may be a polygonal or elliptical shape, and thus, the shape of the notch region NC may also be a polygonal or elliptical shape.

The notch region NC may be disposed to surround an edge of the pad region PDA. The notch region NC may be spaced apart from the pad region PDA by a certain distance. In other words, a size of the notch region NC may be greater than a size of the pad region PDA. The pad region PDA of the display panel 300 is disposed to be completely accommodated in the notch region NC of the protection panel 500 so that a thickness between the main region MA of the display panel 300 and the pad region PDA may be reduced by a thickness of the protection panel 500. As a result, a radius of curvature of the bending region BA of the protrusion region PA may be reduced.

As described above, the stress control member SC may be disposed on the bending region BA of the display panel 300, and a portion of the stress control member SC may extend from the bending region BA and may overlap the pad region PDA. That is, a portion of the stress control member SC may be disposed to overlap the notch region NC. The auxiliary circuit board 315 may be disposed at one side of the stress control member SC. A portion of the auxiliary circuit board 315 may be disposed to overlap the notch region NC.

The touch circuit board 210 of the touch sensing device 200 may be disposed on the stress control member SC and the auxiliary circuit board 315. A portion of the touch circuit board 210 may be disposed to overlap the notch region NC. As described above, the pad region PDA of the display panel 300 may be disposed to be completely accommodated in the notch region NC of the protection panel 500, and at least a partial region of the touch circuit board 210 may be disposed in the notch region NC in a thickness direction, thereby reducing the thickness between the main region MA of the display panel 300 and the touch circuit board 210 by the thickness of the protection panel 500. As a result, a radius of curvature of a bending section of the touch circuit board 210 may be reduced.

Meanwhile, the protection panel 500 may include extension portions such as the first edge ET1 and the second edge ET2. As shown in the drawing, the first edge ET1 and the second edge ET2 may extend to the outside of the display panel 300 from an inner side of the notch region NC by the second distance NC_P in the second direction (Y-axis direction).

The notch region NC may be located between the first edge ET1 and the second edge ET2. The display panel 300, the touch circuit board 210, and the like may be bent near the notch region NC. Since one end of the protection panel 500 has a discontinuous side in the first direction (X-axis direction) due to the notch region NC, an external impact transmitted when the display device 10 or the like is dropped may be diverted along an edge of the notch region NC. As a result, damage and/or electrical disconnection of the display device may be prevented.

Referring to FIGS. 9 and 10, a window adhesive member PSA1 is disposed between the cover window 100 and the touch sensing device 200. The window adhesive member PSA1 couples the cover window 100 and the touch sensing device 200. The panel lower member 400 and an interval maintenance member PSA2 may be disposed between the main region MA of the display panel 300 and the pad region PDA of the protrusion region PA.

Since the panel lower member 400 is disposed on a rear surface of the display panel 300, when the protrusion region PA is bent and thus the pad region PDA faces the main region MA, the panel lower member 400 may include two layers at a position where the main region MA and the pad region PDA overlap each other. Meanwhile, the panel lower member 400 may be omitted in the bending region BA to facilitate bending. According to an exemplary embodiment, a thickness of the panel lower member 400 may be in a range of 0.13 mm to 0.17 mm. Thus, the sum of thicknesses of the panel lower members 400 between the main region MA and the pad region PDA may be in a range of 0.26 mm and 0.34 mm. The panel lower member 400 may include a plurality of functional layers. For example, the panel lower member 400 may include at least one of a heat dissipation layer configured to efficiently dissipate heat from the display panel 300, an electromagnetic wave shielding layer configured to shield an electromagnetic wave, a light blocking layer configured to block light incident from the outside, a light absorption layer configured to absorb light incident from the outside, and a buffer layer configured to absorb an external impact. The thickness of the panel lower member 400 may be reduced as the number of the functional layers included therein is decreased.

The interval maintenance member PSA2 may be disposed between the panel lower members 400 provided with two layers. The interval maintenance member PSA2 couples the two panel lower members 400. As a result, the interval maintenance member PSA2 stably fixes a bent shape of the display panel 300. According to an exemplary embodiment, a thickness of the interval maintenance member PSA2 may be in a range of 0.08 mm to 0.12 mm. When the thickness of the interval maintenance member PSA2 is decreased, a radius of curvature of the display panel 300 may be decreased.

The window adhesive member PSA1 and the interval maintenance member PSA2 may be adhesive members. The adhesive member includes a photo-curable adhesive material or a heat-curable adhesive material, and a material thereof is not particularly limited. The adhesive member may be an OCA, an OCR, or a pressure sensitive adhesive film (PSA). In addition, some of the adhesive members may be omitted.

For convenience of description, a curvature of the bending region BA of the display panel 300 is defined as a first curvature, and a curvature of a region in which the touch circuit board 210 of the touch sensing device 200 is bent is defined as a second curvature. Meanwhile, one inner side surface of the lower cover 600 may be curved along a curved shape of the touch circuit board 210. A curvature of a bending region of the lower cover 600 is defined as a third curvature. When the protrusion region PA of the display panel 300 is bent and thus the pad region PDA is disposed to face the main region MA, a radius of the first curvature may be proportional to the sum of thicknesses of a plurality of members disposed between the pad region PDA and the main region MA.

The second curvature of the touch circuit board 210 may be greater than the first curvature of the display panel 300. Accordingly, the touch circuit board 210 and the bending region BA of the display panel 300 may be spaced apart from each other by a first distance WD1. The third curvature may be greater than the first curvature and the second curvature. Therefore, one inner side surface of the lower cover 600 and the touch circuit board 210 may be spaced apart from each other by a second distance WD2 at a portion at which the lower cover 600 and the touch circuit board 210 overlap the bending region BA of the display panel 300.

The protection panel 500 may be disposed on a portion of the rear surface of the panel lower member 400. According to an exemplary embodiment, the protection panel 500 may be a metal plate, and a thickness of the metal plate may be in a range of 0.1 mm to 0.15 mm. As shown in FIGS. 9 and 10, since the protection panel 500 may be omitted in the notch region NC, the sum of the thicknesses of the plurality of members disposed between the pad region PDA and the main region MA may be equal to the sum of thicknesses of the panel lower member 400 and the interval maintenance member PSA2. That is, a distance between the pad region PDA and the main region MA may be decreased by the thickness of the protection panel 500. Accordingly, a radius of the first curvature may also be decreased. According to an exemplary embodiment, when the protection panel 500 is not omitted, the first curvature of the display panel 300 may be in a range of 0.22 mm to 0.305 mm. On the contrary, when the protection panel 500 is omitted, the radius of the first curvature of the display panel 300 may be in a range of 0.17 mm to 0.23 mm.

When the protection panel 500 is omitted in the notch region NC, the radius of the first curvature of the display panel 300 may be decreased. When the radius of the first curvature is decreased, a radius of the second curvature may also be decreased. Therefore, when the radius of the second curvature is decreased, the second distance WD2 between one inner side surface of the lower cover 600 and the touch circuit board 210 may also decreased at the portion at which the lower cover 600 and the touch circuit board 210 overlap the bending region BA of the display panel 300. That is, an interval between the lower cover 600 and the bending region BA of the display panel 300 and an interval between the lower cover 600 and the touch circuit board 210 may be increased. When the display device 10 is dropped, the lower cover 600 may be temporarily or permanently pushed inward by an external impact. When the interval between the lower cover 600 and the bending region BA of the display panel 300 and the interval between the lower cover 600 and the touch circuit board 210 are sufficiently secured as in the present exemplary embodiment, the touch circuit board 210, the display circuit board 310, and the like may be protected from the external impact.

Hereinafter, other exemplary embodiments will be described. In the following exemplary embodiments, a description of the same configuration as that of the previously described exemplary embodiment will be omitted or simplified, and differences will be mainly described.

Figure 11:
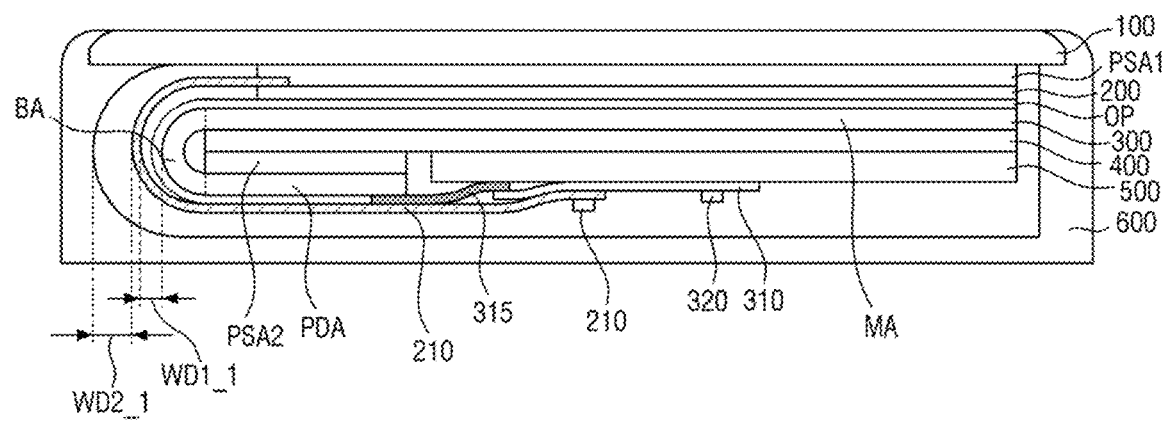
FIG. 11 is a cross-sectional view taken along line II-IF of FIG. 8 according to another exemplary embodiment.
Figure 12:
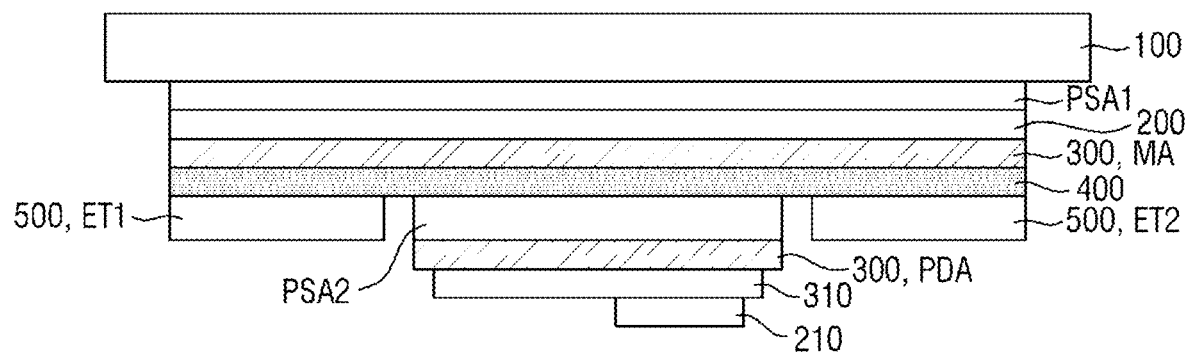
FIG. 12 is a cross-sectional view taken along line of FIG. 8 according to another exemplary embodiment.

FIG. 11 is a cross-sectional view taken along line II-II' of FIG. 8 according to another exemplary embodiment. FIG. 12 is a cross-sectional view taken along line III-III' of FIG. 8 according to another exemplary embodiment.

Referring to FIGS. 11 and 12, the present exemplary embodiment is different from the embodiment shown in FIGS. 9 and 10 in that a panel lower member 400 of only one layer is disposed between a main region MA of a display panel 300 and a pad region PDA of a protrusion region PA.

More specifically, the panel lower member 400 may be disposed on a rear surface of the display panel 300, but only in the main region MA. That is, the panel lower member 400 may not be disposed in the protrusion region PA of the display panel 300. In this case, the panel lower member 400 may include only one layer at a position in which the main region MA and the pad region PDA overlap each other. A thickness of the panel lower member 400 may be in a range of 0.13 mm to 0.17 mm. Thus, the sum of the thickness of the panel lower member 400 between the main region MA and the pad region PDA may be in a range of 0.13 mm and 0.17 mm as ever. The panel lower member 400 may include a plurality of functional layers. For example, the panel lower member 400 may include at least one of a heat dissipation layer configured to efficiently dissipate heat from the display panel 300, an electromagnetic wave shielding layer configured to shield an electromagnetic wave, a light blocking layer configured to block light incident from the outside, a light absorption layer configured to absorb light incident from the outside, and a buffer layer configured to absorb an external impact. The thickness of the panel lower member 400 may be reduced as the number of the functional layers included therein is decreased.

An interval maintenance member PSA2 may be disposed between the panel lower member 400 and the pad region PDA of the display panel 300. The interval maintenance member PSA2 may bond the panel lower member 400 and the pad region PDA of the display panel 300. As a result, the interval maintenance member PSA2 stably fixes a bent shape of the display panel 300. According to an exemplary embodiment, a thickness of the interval maintenance member PSA2 may be in a range of 0.08 mm to 0.12 mm. When the thickness of the interval maintenance member PSA2 is decreased, a radius of curvature of the display panel 300 may be decreased.

For convenience of description, a curvature of a bending region BA of the display panel 300 is defined as a fourth curvature, and a curvature of a region in which a touch circuit board 210 of a touch sensing device 200 is bent is defined as a fifth curvature. Meanwhile, one inner side surface of a lower cover 600 may be curved along a curved shape of the touch circuit board 210. A curvature of a bending region of the lower cover 600 is defined as a sixth curvature. When the protrusion region PA of the display panel 300 is bent and thus the pad region PDA is disposed to face the main region MA, a radius of the fourth curvature may be proportional to the sum of thicknesses of a plurality of members disposed between the pad region PDA and the main region MA.

The fifth curvature of the touch circuit board 210 may be greater than the fourth curvature of the display panel 300. Accordingly, the touch circuit board 210 and the bending region BA of the display panel 300 may be spaced apart from each other by a third distance WD1_1. The sixth curvature may be greater than the fourth curvature and the fifth curvature. Therefore, one inner side surface of the lower cover 600 and the touch circuit board 210 may be spaced apart from each other by a fourth distance WD2_1 at a portion at which the lower cover 600 and the touch circuit board 210 overlap the bending region BA of the display panel 300.

A protection panel 500 may be disposed on a portion of a rear surface of the panel lower member 400. According to an exemplary embodiment, the protection panel 500 may be a metal plate, and a thickness of the metal plate may be in a range of 0.1 mm to 0.15 mm. As shown in FIGS. 11 and 12, since the protection panel 500 may be omitted in a notch region NC, the sum of the thicknesses of the plurality of members disposed between the pad region PDA and the main region MA may be equal to the sum of thicknesses of the panel lower member 400 and the interval maintenance member PSA2. That is, a distance between the pad region PDA and the main region MA may be decreased by the thicknesses of the protection panel 500 and the panel lower member 400 of one layer. Accordingly, a radius of the fourth curvature may also be decreased. According to an exemplary embodiment, when the protection panel 500 and the panel lower member 400 of one layer are not omitted, the fourth curvature of the display panel 300 may be in a range of 0.22 mm to 0.305 mm. On the contrary, when the protection panel 500 is omitted, the radius of the fourth curvature of the display panel 300 may be in a range of 0.105 mm to 0.145 mm. The radius of the fourth curvature may be less than the radius of the first curvature of the display panel 300 in the exemplary embodiment shown in FIGS. 9 and 10. When the protection panel 500 and the panel lower member 400 of one layer are omitted in the notch region NC, the radius of the fourth curvature of the display panel 300 may be decreased.

When the radius of the fourth curvature is decreased, a radius of the fifth curvature may also be decreased. Therefore, when the radius of the fifth curvature is decreased, the fourth distance WD2_1 between one inner side surface of the lower cover 600 and the touch circuit board 210 may also decreased at the portion at which the lower cover 600 and the touch circuit board 210 overlap the bending region BA of the display panel 300. That is, an interval between the lower cover 600 and the bending region BA of the display panel 300 and an interval between the lower cover 600 and the touch circuit board 210 may be increased. When the display device 10 is dropped, the lower cover 600 may be temporarily or permanently pushed inward by an external impact. In this case, when the interval between the lower cover 600 and the bending region BA of the display panel 300 and the interval between the lower cover 600 and the touch circuit board 210 are sufficiently secured as in the present exemplary embodiment, the touch circuit board 210, the display circuit board 310, and the like may be protected from the external impact.

According to a display device according to an exemplary embodiment, a radius of curvature of a region in which the display panel is bent may be decreased, thereby reducing a damage caused by an external impact.

Effects of the present disclosure are not restricted to the exemplary embodiments set forth herein and more diverse effects are included in this specification.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
 a display panel which comprises a main region configured to display an image and a protrusion region protruding from one side of the main region configured to be bent;
 a lower film comprising a heat dissipation layer, which is disposed on a rear surface of the display panel; and
 a metal layer which is disposed on a rear surface of the lower film and comprises a first edge portion, a second edge portion, and a notch region between the first edge portion and the second edge portion at one end thereof, the first edge portion and the second edge portion extending in a same direction in a plan view of the metal layer,
 wherein the notch region has a shape which is recessed inwardly into the display panel from the first and second edge portions of the metal layer so as to accommodate at least a portion of the protrusion region of the display panel,
 the protrusion region comprises a first bending portion which has a first curvature and a pad portion which faces the main region in a thickness direction of the display panel, and
 the pad portion is disposed in the notch region.

2. The display device of claim 1, wherein the notch region is an incision region defined in the metal layer.

3. The display device of claim 1, wherein a shape of the notch region is the same as a shape of the pad portion.

4. The display device of claim 3, wherein the notch region surrounds an edge of the pad portion when viewed from above.

5. The display device of claim 1, wherein a size of the notch region is greater than a size of the pad portion.

6. The display device of claim 1, wherein the lower film is disposed on the main region and the pad portion.

7. The display device of claim 6, wherein the lower film comprises an interval maintenance member between the pad portion and the main region, the interval maintenance member overlaps the pad portion.

8. The display device of claim 1, further comprising a touch panel disposed on the display panel.

9. The display device of claim 8, wherein the touch panel comprises a touch circuit board, and
 the touch circuit board comprises a second bending portion which has a second curvature and a non-bending portion which is configured to face the main region in the thickness direction of the display panel.

10. The display device of claim 9, wherein the non-bending portion is configured to be disposed in the notch region.

11. The display device of claim 9, wherein the first curvature is less than the second curvature.

12. The display device of claim 9, wherein the first bending portion and the second bending portion are spaced apart from each other.

13. The display device of claim 1, further comprising a stress control member disposed on the protrusion region,
 wherein a portion of the stress control member overlaps the notch region.

14. The display device of claim 1, further comprising a lower cover disposed under the metal layer.

15. The display device of claim 14, wherein an inner side surface of the lower cover, which faces the first bending portion, has a third curvature.

16. The display device of claim 15, wherein the first curvature is less than the third curvature.

17. The display device of claim 15, wherein the inner side surface of the lower cover and the first bending portion are spaced apart from each other.

18. A display device comprising:
 a display panel which comprises a main region configured to display an image and a protrusion region protruding from one side of the main region configured to be bent;
 a lower film which is disposed on a rear surface of the display panel; and
 a metal layer disposed on a rear surface of the lower film, the metal layer comprising a first edge portion, a second edge portion, and a notch region between the first edge portion and the second edge portion at one end thereof, the first edge portion and the second edge portion extending in a same direction in a plan view of the metal layer,
 wherein:
 the metal layer is configured to surround the protrusion region of the display panel when the display panel is bent, and the metal layer does not overlap the protrusion region in a thickness direction thereof; and
 the notch region has a shape which is recessed inwardly into the display panel from the first and second edge portions of the metal layer so as to accommodate at least a portion of the protrusion region of the display panel.

* * * * *